(12) United States Patent
Wu et al.

(10) Patent No.: US 10,923,365 B2
(45) Date of Patent: Feb. 16, 2021

(54) CONNECTION STRUCTURE AND METHOD FOR FORMING THE SAME

(71) Applicant: RichWave Technology Corp., Taipei (TW)

(72) Inventors: Chia-Yun Wu, Taipei (TW); Yu-Ling Chiu, Taipei (TW); Tsyr-Shyang Liou, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/658,185

(22) Filed: Oct. 21, 2019

(65) Prior Publication Data

US 2020/0135497 A1 Apr. 30, 2020

Related U.S. Application Data

(60) Provisional application No. 62/751,690, filed on Oct. 28, 2018.

(51) Int. Cl.
| | |
|---|---|
| *H01L 21/56* | (2006.01) |
| *H01L 21/477* | (2006.01) |
| *H01L 23/00* | (2006.01) |
| *H01L 23/31* | (2006.01) |
| *H01L 23/488* | (2006.01) |

(52) U.S. Cl.
CPC .......... *H01L 21/563* (2013.01); *H01L 21/477* (2013.01); *H01L 23/315* (2013.01); *H01L 23/488* (2013.01); *H01L 24/11* (2013.01); *H01L 24/13* (2013.01); *H01L 24/16* (2013.01); *H01L 24/17* (2013.01); *H01L 24/81* (2013.01); *H01L 2224/13144* (2013.01)

(58) Field of Classification Search
CPC ..... H01L 21/563; H01L 21/477; H01L 24/17; H01L 2224/13144; H01L 23/293; H01L 24/16; H01L 24/81; H01L 24/97
See application file for complete search history.

(56) References Cited

U.S. PATENT DOCUMENTS

| | | | | |
|---|---|---|---|---|
| 5,001,542 | A * | 3/1991 | Tsukagoshi | H01L 21/563 257/746 |
| 5,611,140 | A * | 3/1997 | Kulesza | H01L 21/4853 156/299 |
| 6,064,120 | A * | 5/2000 | Cobbley | H01L 24/81 257/780 |
| 6,189,208 | B1 * | 2/2001 | Estes | H01L 21/563 174/260 |
| 6,219,911 | B1 * | 4/2001 | Estes | H01L 24/10 257/E21.511 |
| 6,365,500 | B1 * | 4/2002 | Chang | H01L 24/10 257/E21.511 |

(Continued)

*Primary Examiner* — Ahmed N Sefer
(74) *Attorney, Agent, or Firm* — Winston Hsu

(57) ABSTRACT

A method for forming a connection structure is disclosed. A semiconductor structure having a first pad and a bump respectively on a bottom surface thereof is provided. A carrier having a second pad on a top surface thereof is provided. The second pad corresponds to the bump. An epoxy portion is disposed onto the second pad of the carrier. A diameter of the epoxy portion is less than or equal to a diameter of the bump. After depositing the epoxy portion, the bump is attached to the second pad via the epoxy portion.

17 Claims, 4 Drawing Sheets

(56) References Cited

U.S. PATENT DOCUMENTS

| | | | | |
|---|---|---|---|---|
| 6,981,317 | B1* | 1/2006 | Nishida | H01L 21/563 29/840 |
| 2003/0047339 | A1* | 3/2003 | Lutz | H01L 23/3114 174/558 |
| 2003/0057537 | A1* | 3/2003 | Iwasaki | H01L 23/16 257/684 |
| 2004/0023433 | A1* | 2/2004 | Erikson | H01L 24/16 438/106 |
| 2004/0113215 | A1* | 6/2004 | Shimada | H03H 9/059 257/414 |
| 2005/0090039 | A1* | 4/2005 | Chooi | H01L 24/11 438/106 |
| 2005/0104210 | A1* | 5/2005 | Farnworth | H01L 21/288 257/737 |
| 2007/0013067 | A1* | 1/2007 | Nishida | H01L 21/563 257/737 |
| 2010/0078799 | A1* | 4/2010 | Zarbock | B81C 1/00269 257/690 |
| 2010/0283144 | A1* | 11/2010 | Liang | H03H 9/0523 257/737 |
| 2011/0104857 | A1* | 5/2011 | Roberts | H01L 21/50 438/120 |
| 2013/0234344 | A1* | 9/2013 | Juskey | H01L 25/16 257/778 |
| 2018/0079939 | A1* | 3/2018 | Kubota | C09J 163/08 |

* cited by examiner

CONNECTION STRUCTURE AND METHOD FOR FORMING THE SAME

CROSS REFERENCE TO RELATED APPLICATION

This application claims priority from U.S. provisional application No. 62/751,690 filed Oct. 28, 2018, which is included in its entirety herein by reference.

TECHNICAL FIELD

The present disclosure relates generally to the field of semiconductor technology. More particularly, the present disclosure relates to a connection structure between the semiconductor structure and the carrier and a method for forming the same.

BACKGROUND

As known in the art, semiconductor structures such as surface acoustic wave (SAW) devices are frequently used in commercial applications as radio frequency (RF) and intermediate frequency (IF) filters to provide frequency selectivity and other electronic functions. It is also known that during assembly process, bumps of the semiconductor structure are typically attached to pads on a carrier using a solder. However, the flux splashing that occurs in a solder reflow process often leads to undesired contamination of the bottom surface of the semiconductor structure.

Therefore, there is a need in this industry to provide an improved method for forming a connection structure between the semiconductor structure and the carrier, which is capable of solving the above-mentioned prior art problems and shortcomings.

SUMMARY

It is one object of the present disclosure to provide an improved method for forming a connection structure, which can avoid the above-mentioned prior art shortcomings.

According to one aspect of the invention, a method for forming a connection structure is disclosed. A semiconductor structure having a first pad and a bump respectively on a bottom surface thereof is provided. A carrier having a second pad on a top surface thereof is provided. The second pad corresponds to the bump. An epoxy portion is disposed onto the second pad of the carrier. A diameter of the epoxy portion is less than or equal to a diameter of the bump. After depositing the epoxy portion, the bump is attached to the second pad via the epoxy portion.

According to another aspect of the present invention, a connection structure is disclosed. The connection structure comprises a semiconductor structure having a first pad and a bump respectively on a bottom surface thereof, a carrier having a second pad on a top surface thereof, and an epoxy portion connected between the bump and the second pad. The second pad corresponds to the bump. According to one embodiment of the invention, a diameter of the epoxy portion is less than a diameter of the bump.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
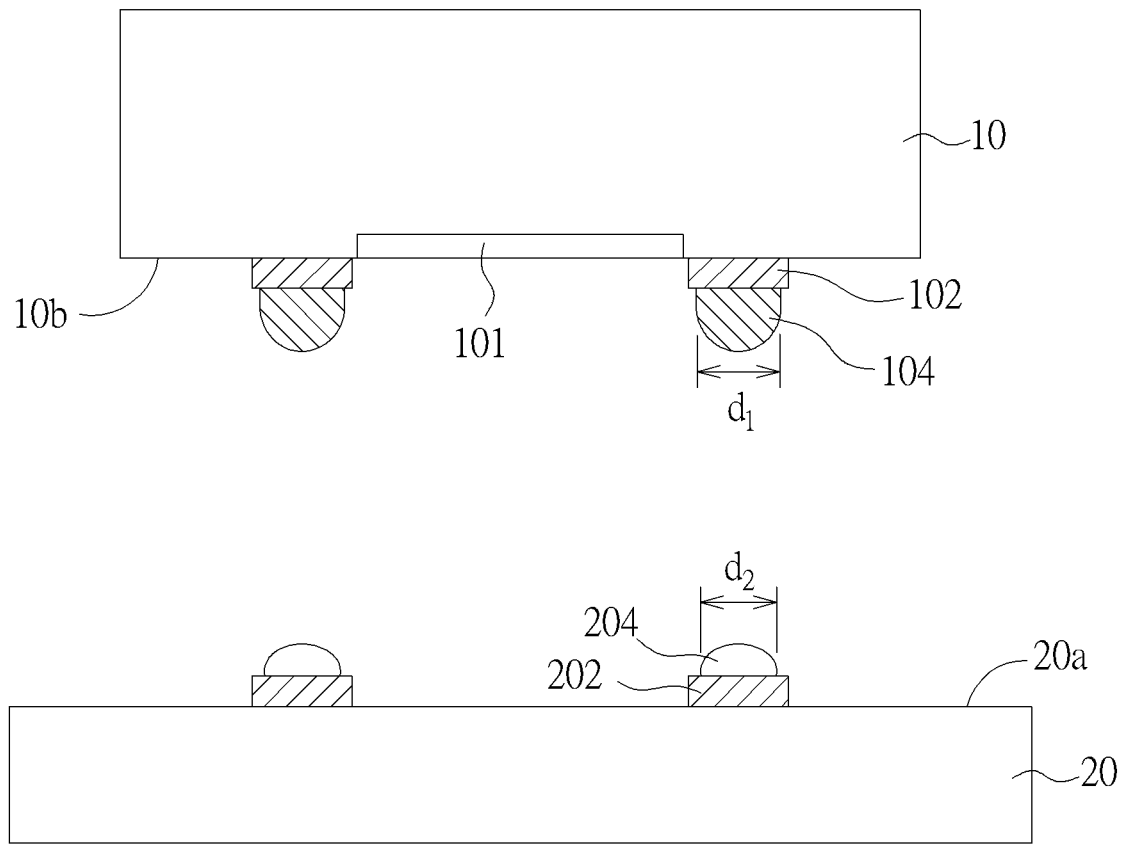
FIG. 1 to FIG. 3 are schematic, cross-sectional diagrams showing a method for forming a connection structure according to one embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The following detailed description is, therefore, not to be taken in a limiting sense, and the scope of the present invention is defined only by the appended claims, along with the full scope of equivalents to which such claims are entitled.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

The terms wafer and substrate used herein include any structure having an exposed surface onto which a material layer is deposited, for example, to form a circuit structure including, but not limited to, an interconnection metal line or a redistribution layer (RDL). The term substrate is understood to include wafers, but not limited thereto. The term substrate is also used to refer to semiconductor structures during processing, and may include other layers that have been fabricated thereupon.

The present disclosure pertains to a connection structure and a method for forming the same. By applying an electrically conductive epoxy portion on the pads of the carrier during assembly process of the semiconductor structure, the problem of contamination of the bottom surface of the semiconductor structure could be avoided.

Figure 2:
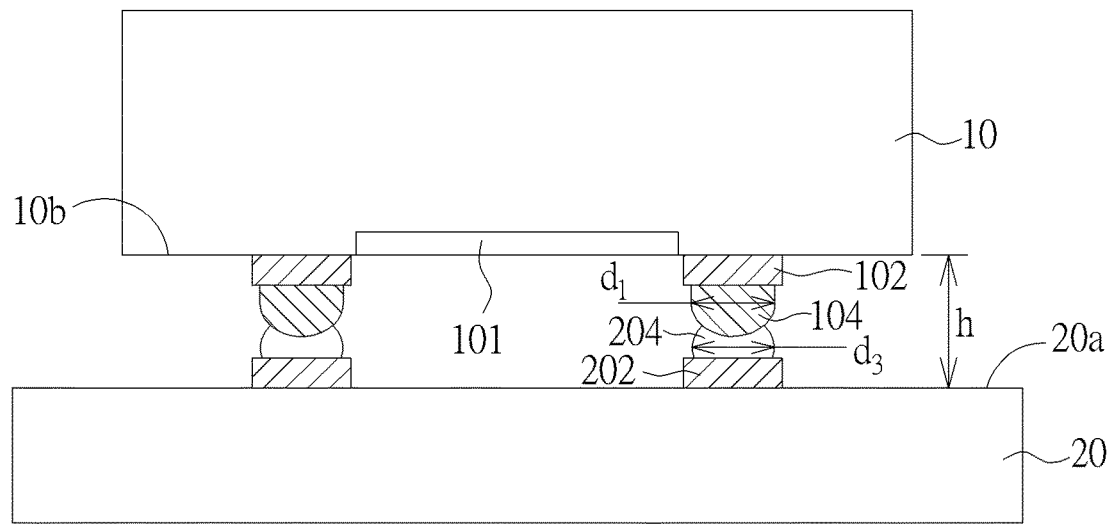
Figure 3:
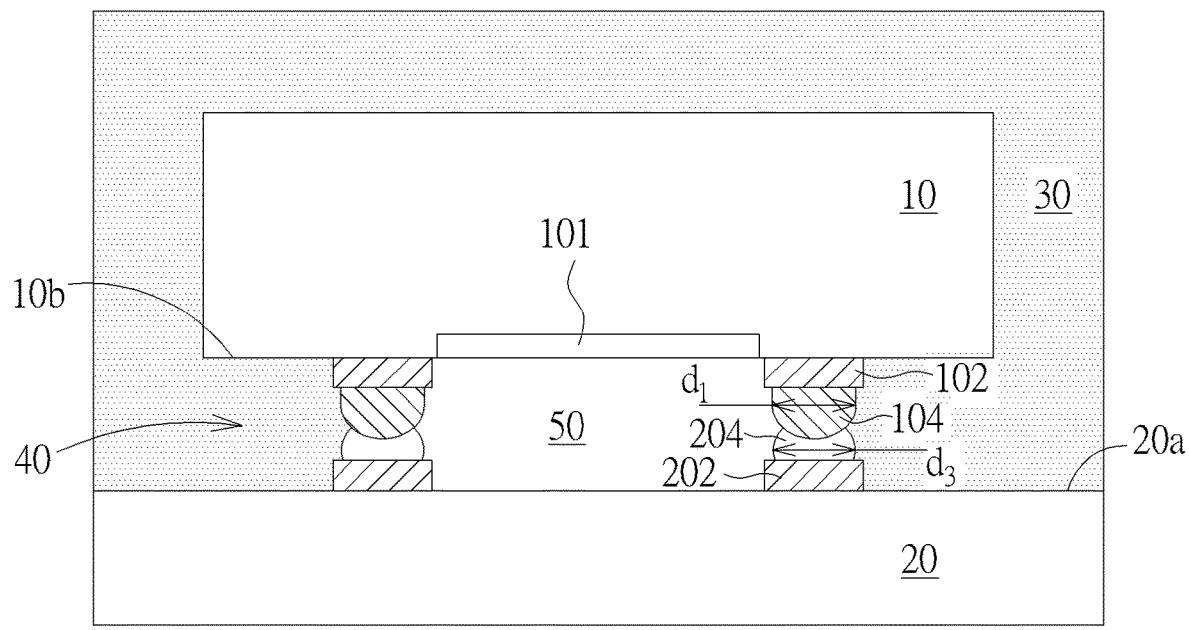

FIG. 1 to FIG. 3 are schematic, cross-sectional diagrams showing a method for forming a connection structure according to one embodiment of the invention. As shown in FIG. 1, a semiconductor structure 10 is provided. According to embodiments of the invention, the semiconductor structure 10 may comprise a wafer or a surface acoustic wave (SAW) chip. For example, the semiconductor structure 10 is a SAW chip having a first pad 102 and a bump 104 respectively on a bottom surface 10b of the semiconductor structure 10. According to one embodiment, for example, the bump 104 is a gold bump, but is not limited thereto. The bump 104 has a diameter $d_1$. At least a circuit element 101 such as an interdigital transducer (IDT) may be disposed on the bottom surface 10b of the semiconductor structure 10.

Although not shown in the figures, it is known that an IDT may be a series of thin metal strips or "fingers" fabricated on a suitable piezoelectric substrate. One set of fingers is connected to an input/output terminal, while the opposite set of fingers is connected to a second terminal. In single-ended IDTs, the second terminal is grounded. For differential input signals however, the second terminal is a pulse input/output terminal.

Still referring to FIG. 1, a carrier 20 is provided. The carrier 20 may comprise a second pad 202 on a top surface 20a of the carrier 20. According to one embodiment, the second pad 202 corresponds to the bump 104. When assembling, the bump 104 is aligned with the second pad 202. According to one embodiment, the carrier 20 may comprise a high-temperature co-fired ceramic (HTCC) substrate, a low-temperature co-fired ceramic (LTCC) substrate, a silicon substrate, or a printed circuit board (PCB). According to one embodiment, a solder mask may be disposed on the top surface 20a to protect copper traces on the top surface 20a from oxidation. According to one embodiment, the second pad 202 may be a metal pad comprising gold, copper, aluminum, titanium, titanium nitride, silver or any combinations thereof.

According to one embodiment, an epoxy portion 204 is disposed onto the second pad 202 of the carrier 20. According to one embodiment, the epoxy portion 204 may be deposited onto the second pad 202 by stencil printing or any suitable methods known in the art.

According to one embodiment, a diameter $d_2$ of the epoxy portion 204 is less than or equal to the diameter $d_1$ of the bump 104. According to one embodiment, the epoxy portion 204 is electrically conductive. For example, the epoxy portion 204 comprises silver and epoxy resin, but is not limited thereto.

As shown in FIG. 2, after depositing the epoxy portion 204, the semiconductor structure 10 is moved close to the top surface 20a of the carrier 20 until the bump 104 is in direct contact with the epoxy portion 204 such that the bump 104 is attached to the second pad 202 via the epoxy portion 204. Subsequently, a curing process is performed to cure the epoxy portion 204 by heating after attaching the bump 104 to the second pad 202. For example, the epoxy portion 204 may be cured under the following conditions: ramp to 150° C. in 60 minutes and cure at 150° C. for 60 minutes in an oven.

According to one embodiment, the epoxy portion 204 may have a viscosity of less than 12000 cps at room temperature before attaching the bump 104 to the second pad 202. According to one embodiment, the epoxy portion 204 may have a viscosity of greater than 8000 cps at room temperature before attaching the bump 104 to the second pad 202. Preferably, the viscosity of the epoxy portion 204 is chosen to be less than 12000 cps (for example, at 25° C.) before the bump 104 is attached to the second pad 202, thus the undesirable adhesion is reduced in the assembly process. In addition, when the curing processing is performed by heating the epoxy portion 204, the epoxy portion 204 is hardly to be deformed because of the chosen viscosity range, therefore, the epoxy portion 204 is hardly contacting the bottom surface 10b of the semiconductor structure 10, and the risk of the semiconductor structure-surface contamination is reduced.

According to one embodiment, the epoxy portion 204 may have a resistivity of less than $5 \times 10^{-5}$ ohm-cm for providing the better electric conductivity and reducing the influence on the performance of the semiconductor structure 10. According to one embodiment, the epoxy portion 204 may have a thickness ranging between 0.03 mm and 0.07 mm before attaching the bump 104 to the second pad 202. According to one embodiment, the diameter $d_3$ of the epoxy portion 204 is less than or equal to the diameter $d_1$ of the bump 104 after attaching the bump 104 to the second pad 202.

According to one embodiment, a height h between the bottom surface 10b of the semiconductor structure 10 and the top surface 20a of the carrier 20 is more than 10 μm after attaching the bump 104 to the second pad 202. By providing such configuration, the influence on the performance of the semiconductor structure 10 is reduced. According to one embodiment, the bump 104 is not in physical contact with the second pad 202.

As shown in FIG. 3, a dry film 30 is then laminated onto the semiconductor structure 10 and the top surface 20a of the carrier 20. According to one embodiment, the dry film 30 may comprise an epoxy resin film. According to one embodiment, the dry film 30 may extend into a gap 40 between the bottom surface 10b of the semiconductor structure 10 and the top surface 20a of the carrier 20. The circuit element 101 of the semiconductor structure 10 is located within a cavity 50 sealed between the dry film 30, the bottom surface 10b of the semiconductor structure 10 and the top surface 20a of the carrier 20.

It is advantageous to use the present disclosure because by applying the epoxy portion 204, a conventional solder reflow process can be omitted. Therefore, the risk of contaminating the bottom surface 10b of the semiconductor structure 10 is reduced. By controlling the diameter and the thickness of the epoxy portion 204, the contacting area between the epoxy portion 204 and the side edge of the bump 104 can be reduced, which may reduce the risk that the epoxy portion 204 contacts the bottom surface 10b of the semiconductor structure 10 via the side edge of the bump 104. By selecting suitable viscosity of the epoxy portion 204, the undesirable adhesion is reduced in the assembly process and the risk of the semiconductor structure-surface contamination is reduced. By selecting suitable resistance of the epoxy portion 204, the influence on the performance of the semiconductor structure 10 is reduced. Further, because an adequate height h between the bottom surface 10b of the semiconductor structure 10 and the top surface 20a of the carrier 20 can be maintained, the influence on the performance of the semiconductor structure 10 is reduced. Therefore, the method as disclosed can significantly improve the reliability of the assembly of the SAW chip on the carrier.

Figure 4:
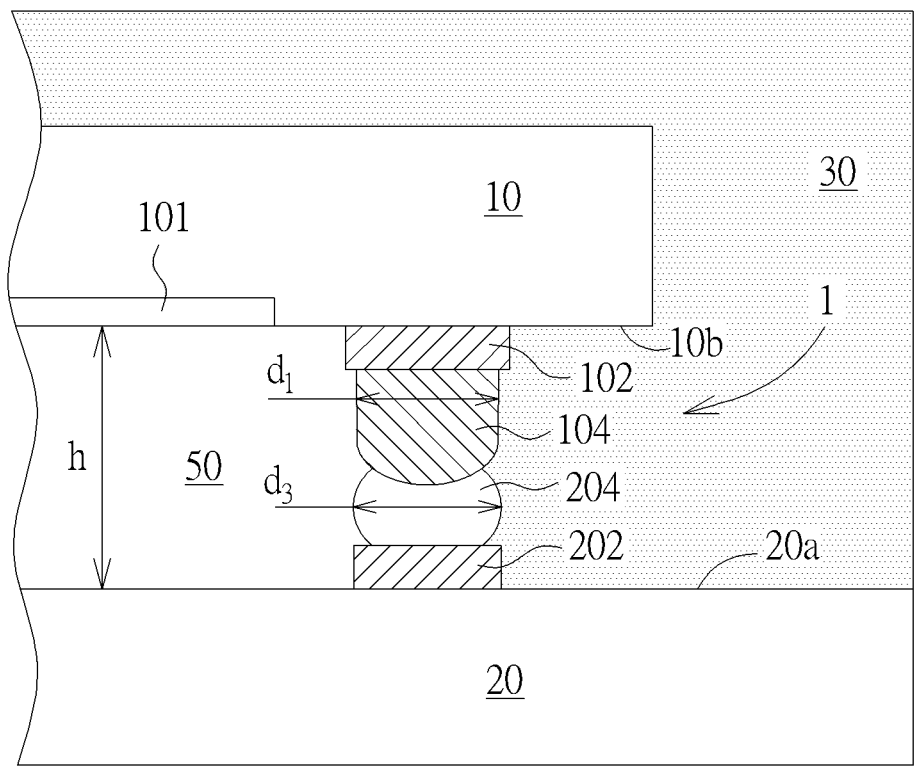
FIG. 4 is an enlarged cross-sectional view of a connection structure according to one embodiment of the invention.

FIG. 4 is an enlarged cross-sectional view of a connection structure according to one embodiment of the invention, wherein like numeral numbers designate like elements, regions, or layers. As shown in FIG. 4, the connection structure 1 comprises a semiconductor structure 10 having a first pad 102 and a bump 104 respectively on a bottom surface 10b of the semiconductor structure 10. A carrier 20 having a second pad 202 on a top surface 20a of the carrier 20 is provided. The second pad 202 corresponds to the bump 104. The connection structure 1 further comprises an epoxy portion 204 connected between the bump 104 and the second pad 202. A diameter $d_3$ of the epoxy portion 204 is less than or equal to a diameter $d_1$ of the bump 104 after attaching the bump 104 to the second pad 202.

According to one embodiment, the semiconductor structure 10 may comprise a wafer or a SAW chip. According to one embodiment, the carrier 20 may comprise a HTCC substrate, a LTCC substrate, a silicon substrate, or a PCB. According to one embodiment, the bump is a gold bump. According to one embodiment, the second pad 202 is a metal pad comprising gold, copper, aluminum, titanium, titanium nitride, silver or any combinations thereof.

According to one embodiment, the epoxy portion is electrically conductive. According to one embodiment, the epoxy portion 204 may comprise silver and epoxy resin. According to one embodiment, the epoxy portion 204 may have a resistivity of less than $5 \times 10^{-5}$ ohm-cm. According to one embodiment, a height h between the bottom surface 10b of the semiconductor structure 10 and the top surface 20a of the carrier 20 is more than 10 µm.

According to one embodiment, the connection structure 1 may further comprise a dry film 30 laminated on the semiconductor structure 10 and the top surface 20a of the carrier 20. According to one embodiment, the dry film 30 may comprise an epoxy resin film. The circuit element 101 of the semiconductor structure 10 is located within a cavity 50 sealed between the dry film 30, the bottom surface 10b of the semiconductor structure 10 and the top surface 20a of the carrier 20.

Figure 5:
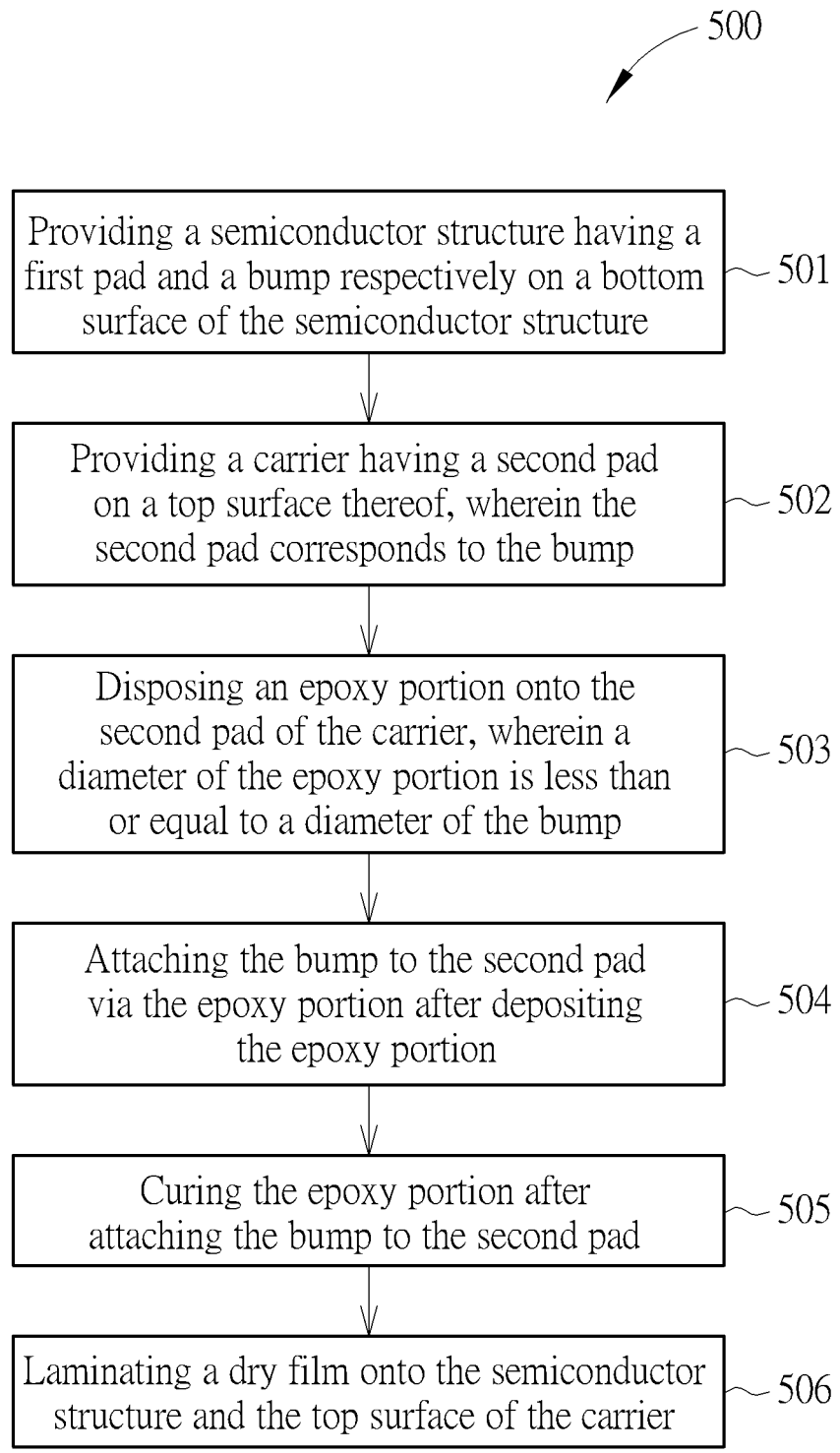
FIG. 5 is a flow diagram showing a method for forming a connection structure according to one embodiment of the invention.

Please refer to FIG. 5, and briefly to FIGS. 1-3. FIG. 5 is a flow diagram showing a method 500 for forming a connection structure according to one embodiment of the invention. As shown in FIG. 4 and FIG. 5, in Step 501, the semiconductor structure 10 is provided. The semiconductor structure 10 comprises the first pad 102 and the bump 104 on the bottom surface 10b of the semiconductor structure 10. In Step 502, a carrier 20 having a second pad 202 on its top surface 20a is provided. The second pad 202 corresponds to the bump 104. According to one embodiment, the second pad 202 is aligned with the bump 104. In Step 503, an epoxy portion 204 is disposed onto the second pad 202 of the carrier 20. A diameter $d_2$ of the epoxy portion 204 is less than or equal to a diameter $d_1$ of the bump 104. In Step 504, the bump 104 is attached to the second pad 202 via the epoxy portion 204 after depositing the epoxy portion 204. In Step 505, the epoxy portion 204 is cured by heating after attaching the bump 104 to the second pad 202. In Step 506, a dry film 30 is laminated onto the semiconductor structure 10 and the top surface 20a of the carrier 20.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a connection structure, comprising:
   providing a semiconductor structure having a first pad and a bump respectively on a bottom surface thereof, wherein the semiconductor structure comprises a surface acoustic wave (SAW) chip, and wherein at least a circuit element is disposed on the bottom surface of the semiconductor structure;
   providing a carrier having a second pad on a top surface thereof, wherein the second pad corresponds to the bump;
   disposing an epoxy portion onto the second pad of the carrier, wherein a diameter of the epoxy portion is less than or equal to a diameter of the bump, wherein a material of the bump is different from a material of the epoxy portion;
   after depositing the epoxy portion, attaching the bump to the second pad via the epoxy portion, wherein the bump is in direct contact with the epoxy portion; and
   laminating a dry film onto the semiconductor structure and the top surface of the carrier, wherein the dry film extends into a gap between the bottom surface of the semiconductor structure and the top surface of the carrier, and wherein the circuit element is located within a cavity sealed between the dry film, the bottom surface of the semiconductor structure, and the top surface of the carrier.

2. The method for forming the connection structure of claim 1, wherein the epoxy portion is electrically conductive.

3. The method for forming the connection structure of claim 2, wherein the epoxy portion comprises silver and epoxy resin.

4. The method for forming the connection structure of claim 1, wherein the epoxy portion has a viscosity of less than 12000 cps at room temperature before attaching the bump to the second pad.

5. The method for forming the connection structure of claim 1, wherein the epoxy portion has a viscosity of greater than 8000 cps at room temperature before attaching the bump to the second pad.

6. The method for forming the connection structure of claim 1, wherein the epoxy portion has a resistivity of less than $5 \times 10^{-5}$ ohm-cm.

7. The method for forming the connection structure of claim 1, wherein the diameter of the epoxy portion is less than the diameter of the bump after attaching the bump to the second pad.

8. The method for forming the connection structure of claim 1, wherein the epoxy portion has a thickness ranging between 0.03 mm and 0.07 mm before attaching the bump to the second pad.

9. The method for forming the connection structure of claim 1, wherein a height between the bottom surface of the semiconductor structure and the top surface of the carrier is more than 10 µm after attaching the bump to the second pad.

10. The method for forming the connection structure of claim 1, wherein the epoxy portion is deposited onto the second pad by stencil printing.

11. The method for forming the connection structure of claim 1, further comprising:
    curing the epoxy portion by heating after attaching the bump to the second pad.

12. The method for forming the connection structure of claim 11, wherein the epoxy portion is cured under the following conditions: ramp to 150° C. in 60 minutes and cure at 150° C. for 60 minutes.

13. The method for forming the connection structure of claim 1, wherein the bump is a gold bump.

14. The method for forming the connection structure of claim 1, wherein the second pad is a metal pad comprising gold, copper, aluminum, titanium, titanium nitride, silver, or any combinations thereof.

15. The method for forming the connection structure of claim 1, wherein the carrier comprises a high-temperature co-fired ceramic (HTCC) substrate, a low-temperature co-fired ceramic (LTCC) substrate, a silicon substrate, or a printed circuit board (PCB).

16. The method for forming the connection structure of claim 1, wherein the dry film is an epoxy resin film.

17. A connection structure, comprising:
    a semiconductor structure having a first pad and a bump respectively on a bottom surface thereof, wherein the semiconductor structure comprises a surface acoustic wave (SAW) chip, and wherein at least a circuit element is disposed on the bottom surface of the semiconductor structure;
a carrier having a second pad on a top surface thereof, wherein the second pad corresponds to the bump;
an epoxy portion connected between the bump and the second pad, wherein a material of the bump is different from a material of the epoxy portion, and wherein the bump is in direct contact with the epoxy portion;
wherein a diameter of the epoxy portion is less than a diameter of the bump; and
a dry film laminated onto the semiconductor structure and the top surface of the carrier, wherein the dry film extends into a gap between the bottom surface of the semiconductor structure and the top surface of the carrier, and wherein the circuit element is located within a cavity sealed between the dry film, the bottom surface of the semiconductor structure, and the top surface of the carrier.

\* \* \* \* \*